(12) United States Patent
Hikmet

(10) Patent No.: US 8,393,745 B2
(45) Date of Patent: Mar. 12, 2013

(54) ILLUMINATION DEVICE WITH A PHOSPHOR

(75) Inventor: Rifat Ata Mustafa Hikmet, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 13/265,076

(22) PCT Filed: Apr. 19, 2010

(86) PCT No.: PCT/IB2010/051686
§ 371 (c)(1),
(2), (4) Date: Oct. 18, 2011

(87) PCT Pub. No.: WO2010/122471
PCT Pub. Date: Oct. 28, 2010

(65) Prior Publication Data
US 2012/0057325 A1    Mar. 8, 2012

(30) Foreign Application Priority Data

Apr. 21, 2009   (EP) ...................................... 09158357

(51) Int. Cl.
*F21V 9/16* (2006.01)
(52) U.S. Cl. ................ 362/84; 362/311.04; 362/311.06; 362/296.05
(58) Field of Classification Search ............. 362/19, 362/84, 296.01, 296.05, 308, 310, 311.02–311.04, 362/311.06, 551, 555, 582, 583, 327, 329; 313/483, 485, 486, 502–504; 257/98; 385/129
See application file for complete search history.

(56) References Cited

U.S. PATENT DOCUMENTS

| 8,096,668 B2 * | 1/2012 | Abu-Ageel ..................... 362/84 |
| 2005/0269582 A1 | 12/2005 | Mueller et al. |
| 2006/0202105 A1 | 9/2006 | Krames et al. |
| 2007/0267646 A1 | 11/2007 | Wierer, Jr. et al. |
| 2008/0006840 A1 | 1/2008 | Camras et al. |
| 2010/0315817 A1 * | 12/2010 | Zimmermann .......... 362/296.01 |

FOREIGN PATENT DOCUMENTS

| DE | 102005062514 A1 | 3/2007 |
| EP | 0936682 A1 | 8/1999 |
| JP | 2004053945 A | 2/2004 |
| WO | 2006114726 A2 | 11/2006 |
| WO | 2007044472 A2 | 4/2007 |
| WO | 2009041767 A2 | 4/2009 |

* cited by examiner

*Primary Examiner* — Thomas Sember
(74) *Attorney, Agent, or Firm* — Mark L. Beloborodov

(57) ABSTRACT

The invention relates to an illumination device and a method adapted for illuminating applications. The illumination device (5) with a phosphor (1) comprising at least one light emitting surface which is adapted for emitting phosphor light in a predefined solid angle, a light source (2) being adapted for emitting optical radiation directed to the phosphor (1), a waveguide (3), and a reflector (4), wherein the phosphor (1) is optically coupled to the waveguide (3), the exit surface of the illumination device (5) from which light is emitted is larger than any single light emitting surface of the phosphor (1), and the reflector (4) is adapted for reflecting at least a part of the optical radiation emitted from the illumination device (5) by a surface different from the exit surface of the illumination device (5). In this way, a high light extraction efficiency from a single surface of a luminescent material and at the same time a high quantum efficiency of the illumination device is achieved.

15 Claims, 6 Drawing Sheets

ILLUMINATION DEVICE WITH A PHOSPHOR

FIELD OF THE INVENTION

The invention relates to the field of illumination devices comprising a phosphor and to the field of methods, adapted for illuminating applications.

BACKGROUND OF THE INVENTION

Document WO 2007/044472 A2 describes an efficient or higher luminance light emitting diode assembly which may be formed from a high power light emitting diode chip having a first surface and a second surface, the first surface being mounted to a substrate, wherein the second surface is in intimate thermal contact with a light transmissive heat sink having a thermal conductivity larger than 30 Watts per meter-Kelvin. The LED chip is otherwise in electrical contact with at least a first electrical connection and a second electrical connection for powering the LED chip. Providing light transmissive heat sink doubles the heat conduction from the LED dies thereby avoids excess heating of the phosphor increasing life and/or efficiency and/or luminance and/or a balance of the three.

In remote laser lighting concept, typically phosphor is pumped from one of the surfaces and the generated light by the phosphor needs to be extracted from the opposite surface. In a transparent phosphor total internal reflection, TIR for short, takes place. However, it is known that light emission by the phosphor occurs in all directions. Therefore, it is difficult to avoid light being emitted by the phosphor (phosphor light) propagating in the direction of the pump source, such as a light emitting diode, LED for short, or a laser. In case of a LED phosphor light propagating in the direction of the LED is partially absorbed reducing the efficiency of the system. To sum up, it is difficult to pump a luminescent material from a surface and extract light from another surface with a high efficiency.

SUMMARY OF THE INVENTION

It is an object of the invention to provide a possibility to gain a high light extraction efficiency from a single surface of a luminescent material in conjunction with a high system efficiency.

This object is achieved by the subject matter of the independent claims. Preferred embodiments are defined in the sub claims.

According to a first aspect of the invention, this object is achieved by an illumination device with a phosphor comprising at least one light emitting surface which is adapted for emitting phosphor light in a predefined solid angle, a light source being adapted for emitting optical radiation directed to the phosphor, a waveguide, and a reflector, wherein the phosphor is optically coupled to the waveguide, the exit surface of the illumination device from which light is emitted is larger than any single light emitting surface of the phosphor, and the reflector is adapted for reflecting at least a part of the optical radiation emitted from the illumination device by a surface different from the exit surface of the illumination device. Preferably, optical radiation escapes the illumination device from the exit surface of the waveguide.

The term "light emitting surface of the phosphor" means that, in general, light can be emitted in a predefined solid angle, not that light is actually emitted in the special design of the illumination device. Actually a "light emitting surface of the phosphor" is such a surface which also could be used for emitting phosphor light for illumination purposes if the waveguide was not present. The term "exit surface of the illumination device" means the surface from which light of the illumination device is actually emitted for illumination purposes, this can be a surface of the waveguide alone or a combination of surfaces of the waveguide and the phosphor.

The feature that the exit surface of the illumination device from which light is emitted is larger than any single light emitting surface of the phosphor is to be understood in such a way that the exit surface of the illumination device from which light is emitted is larger than any or each single light emitting surface of the phosphor, respectively. Further, the feature that the reflector is adapted for reflecting at least a part of the optical radiation emitted from the illumination device by a surface different from the exit surface of the illumination device does not exclude that the reflector may also reflect at least a part of the optical radiation emitted from the exit surface of the illumination device.

It is noted that the term "exit surface of the illumination device" in a configuration where a waveguide is arranged on top of the phosphor refers to the surface area of the waveguide. In another configuration where the waveguide is arranged near or next to the phosphor, the term "exit surface of the illumination device" refers to the sum of the surfaces of the phosphor and of the waveguide from which light can escape the illumination device. The term "a phosphor comprising at least one light emitting surface which is adapted for emitting phosphor light in a predefined solid angle" means that the phosphor emits luminescent optical radiation from at least one output surface.

According to a preferred embodiment of the invention, the light emitting surface of the phosphor comprises a flat surface. The predefined solid angle is preferably $\leq 2\pi$, more preferably $\leq 1.8\pi$.

Preferably, the reflector is arranged on at least a part of a side surface and/or on at least a part of an exit surface. Further, according to a preferred embodiment of the invention, the waveguide comprises an optical contact with the phosphor from at least one light emitting surface. The phosphor preferably comprises a low scattering transparent material, more preferably a ceramic phosphor and/or a polymer doped with organic phosphor. It is worth noting that the luminescent material is preferably pumped by a surface different from the light emitting surface of the phosphor.

Preferably, the waveguide comprises a flat waveguide coupled from the top surface and/or a side surface to the phosphor. The waveguide preferably comprises a reflector, more preferably a diffuse reflector. Preferably, the reflector comprises a diffuse reflector adapted for redistributing light to different angles. Preferably, the optical coupling between the phosphor and the waveguide comprises a predetermined angle between the exit surface of the phosphor and the entrance surface of the waveguide, more preferably the optical coupling between the phosphor and the waveguide comprises an optical matching of the refractive indices of the phosphor and of the waveguide. The optical coupling between the phosphor and the waveguide preferably comprises a material with a refractive index $\geq 1.4$ more preferably matching the refractive index of the phosphor or the waveguide.

According to a preferred embodiment of the invention, a transparent waveguide is arranged on top of the transparent phosphor, and at least a part out of the plurality of layers is optically coupled with a high refractive index material. According to another preferred embodiment of the invention, a transparent waveguide is arranged next to at least a part of the side surface and is optically coupled from at least a part of the side surface with a high refractive index material. According to another preferred embodiment of the invention, a transparent waveguide is provided comprising a diffuse reflector.

According to yet another preferred embodiment of the invention, the side surface of the phosphor comprises an inclination angle to the entrance surface of the waveguide different from a perpendicular angle. Preferably, the illumination device further comprises a transparent layer with a transparent material different from the material of the waveguide, wherein the transparent layer is arranged between the phosphor and the waveguide. Preferably, an exit surface of the waveguide and/or the exit surface of the illumination device comprise(s) a shape corresponding to a plain shape, a concave shape, a convex shape and/or a zigzag shape. The zigzag shape preferably corresponds to a Fresnel lens.

According to yet another preferred embodiment of the invention, the illumination device further comprises at least a film arranged on top of an exit surface of the waveguide, the film being preferably adapted for polarizing the optical radiation irradiated from the exit surface of the waveguide. Preferably, the illumination device further comprises a selective reflector adapted for selectively transmitting and/or reflecting optical radiation, wherein the selective reflector is arranged in an optical path between the light source and the phosphor. Preferably, the illumination device further comprises a heat sink adapted for cooling the phosphor. Preferably, the material of the waveguide comprises glass, alumina, a transparent polymer, such as silicone rubber, and/or sapphire.

According to yet another preferred embodiment of the invention, the light source comprises a light emitting diode and/or a laser. Preferably, the light emitting diode comprises an inorganic material and/or an organic material. Preferably, the laser comprises a semiconductor laser and/or a solid-state laser.

According to a second aspect of the invention, above mentioned object is solved by a method, adapted for illuminating applications, comprising the steps: a) emitting optical radiation directed to a phosphor being optically coupled to a waveguide, b) directing optical radiation through the phosphor comprising at least one light emitting surface which is adapted for emitting phosphor light in a predefined solid angle, wherein the exit surface of an illumination device according to the first aspect of the invention and comprising the phosphor and the waveguide, from which light is emitted is larger than any single light emitting surface of the phosphor.

It is an essential idea of the invention to use a transparent phosphor in combination with a transparent material in such a geometrical configuration comprising an increased effective escape surface area in the phosphor with respect to the area pump light enters the phosphor. In this way, a high emission is obtained from a single surface with a large effective area when the surface light enters the phosphor. In this way it is possible that more than three times as much light is emitted from the surface opposite to the pumped surface.

It is worth noting that totally initially reflected light is preferably waveguided through a transparent waveguide to areas where the light is coupled out by a diffuse reflector surrounding it. The diffuse reflector is preferably placed around the luminescent material. When using a laser at the entrance surface, a dichroic mirror is preferably used to send back the phosphor light towards the exit surface. When an LED is used at the entrance surface, it preferably reflects the light towards the exit surface. The extraction efficiency is very large as less light will be sent to the poorly reflecting LED using the illumination device according to the first aspect of the invention. It is worth noting that for a laser pump system an efficiency close to 100% can be achieved.

Preferably, the luminescent material is a highly transparent ceramic phosphor. According to other preferred embodiments of the invention, luminescent materials are selected from garnets and nitrides, preferably doped with trivalent cerium or divalent europium, respectively. Embodiments of garnets comprise $A_3B_5O_{12}$ garnets, wherein A comprises yttrium and/or lutetium and wherein B comprises aluminium. Such garnets are preferably doped with cerium (Ce), with praseodymium (Pr) or a combination of cerium and praseodymium, in particular with Ce. B preferably comprises aluminium (Al). According to other preferred embodiments of the invention, B comprises gallium (Ga) and/or scandium (Sc) and/or indium (In), preferably up to about 20% of Al, more preferably up to about 10% of Al, i.e. the B ions preferably comprise 90 or even more mole % of Al and comprise 10 or even less mole % of one or more of Ga, Sc and In.

B preferably comprises up to about 10% gallium. Preferably, B and O are at least partly replaced by Si and N. The element A is preferably selected from the group comprising yttrium (Y), gadolinium (Gd), terbium (Tb) and lutetium (Lu). Further, Gd and/or Tb are preferably present up to an amount of about 20% of A. Preferably, the garnet luminescent material comprises $(Y_{1-x}Lu_x)_3B_5O_{12}$:Ce, wherein x is equal to or larger than 0 and equal to or smaller than 1. The term ":Ce", indicates that at least part of the metal ions (i.e. in the garnets: part of the "A" ions) in the luminescent material is preferably replaced by Ce. For instance, assuming $(Y_{1-x}Lu_x)_3Al_5O_{12}$:Ce, part of Y and/or Lu is replaced by Ce. This notation is known to the person skilled in the art. Ce will replace A in general for not more than 10%; in general, the Ce concentration will be in the range between 0.1% to 4%, especially between 0.1% to 2% (relative to A). Assuming 1% Ce and 10% Y, the full correct formula is $(Y_{0.1}Lu_{0.89}Ce_{0.01})_3Al_5O_{12}$. Ce in garnets is preferably in the trivalent state, as known to the person skilled in the art.

The red luminescent material preferably comprises a material selected from the group comprising (Ba,Sr,Ca)S:Eu, (Ba,Sr,Ca)AlSiN$_3$:Eu and $(Ba,Sr,Ca)_2Si_5N_8$:Eu. In these compounds, europium (Eu) is preferably divalent, and replaces one or more of the indicated divalent cations. In general, Eu will not be present in amounts larger than 10% of the cation, preferably in the range between about 0.5 to 10, more preferably in the range between about 0.5 to 5% relative to the cation(s) it replaces. The term ":Eu", indicates that part of the metal ions is replaced by Eu (such as by $Eu^{2+}$). For instance, assuming 2% Eu in CaAlSiN$_3$:Eu, the correct formula is $(Ca_{0.98}Eu_{0.02})AlSiN_3$. Divalent europium preferably replaces divalent cations, such as the above divalent alkaline earth cations, preferably Ca, Sr or Ba.

The material (Ba,Sr,Ca)S:Eu can also be indicated as MS:Eu, wherein M comprises an element selected from the group comprising barium (Ba), strontium (Sr) and calcium (Ca). Preferably, M comprises in this compound calcium or strontium, or calcium and strontium, more preferably calcium. Here, Eu is introduced and preferably replaces at least a part of M (i.e. at least one of Ba, Sr, and Ca). Further, the material $(Ba,Sr,Ca)_2Si_5N_8$:Eu can also be indicated as $M_2Si_5N_8$:Eu, wherein M comprises an element selected from the group comprising barium (Ba), strontium (Sr) and calcium (Ca). Preferably, M comprises in this compound Sr and/or Ba. According to another preferred embodiment, M comprises Sr and/or Ba (neglecting the presence of Eu), more preferably 50% to 100%, more preferably 50 to 90% Ba and 50% to 0%, most preferably 50% to 10% Sr, such as Ba$_{1.5}$Sr$_{0.5}$Si$_5$N$_8$:Eu (i.e. 75% Ba; 25% Sr). Here, Eu is introduced and preferably replaces at least a part of M i.e. at least one of Ba, Sr, and Ca.

Likewise, the material (Ba,Sr,Ca)AlSiN$_3$:Eu is indicated as MAlSiN$_3$:Eu, wherein M comprises an element selected from the group comprising barium (Ba), strontium (Sr) and calcium (Ca). M preferably comprises in this compound calcium or strontium, or calcium and strontium, more preferably calcium. Here, Eu is introduced and preferably replaces at least a part of M (i.e. at least one of Ba, Sr, and Ca). BaMgAl$_{10}$O$_{17}$:Eu$^{2+}$ (BAM) comprises a suitable material which emits in the blue.

Inorganic phosphors with a cubic crystal structure are most preferred due to their high transparency even in a polycrystalline state. Preferably, also highly transparent polymers are used, such as poly methyl methacrylate doped with organic luminescent small molecules such as difluoro-boraindacene family (BODIPY), fluorescein dyes, fluerene derivatives, coumarin dyes, xanthene dyes, pyrromethene-BF2 (P-BF2) complexes, stillbene derivatives, rodamine dyes, perylene carboximide dyes and luminescent organic metal complexes such as Lanthanide(III) b-diketonate complexes. It is possible to use luminescent polymers such as polyphenylenevinylenes (PPV)'s derivatives, polyphenyls, and poly fluerenes and their copolymers and mixtures.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
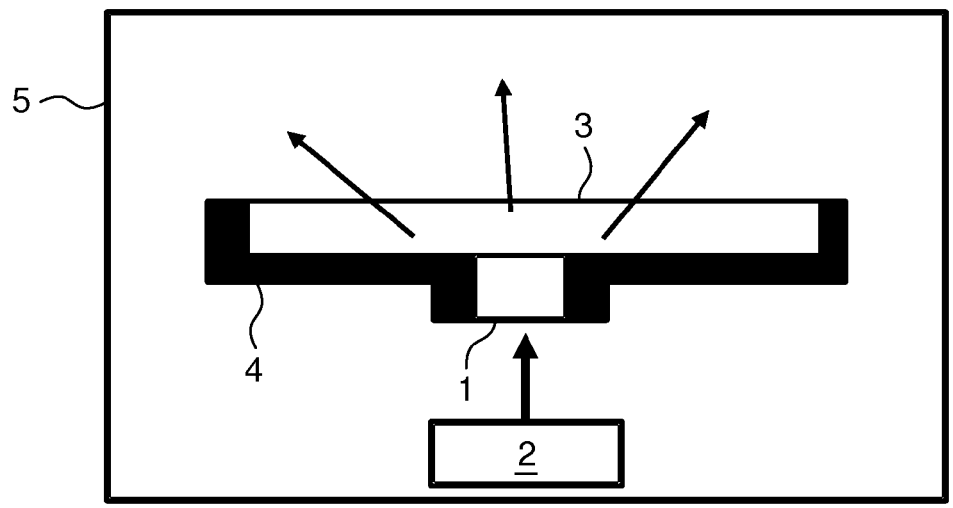
FIG. 1 shows an illumination device according to a first preferred embodiment of the invention.

FIG. 1 shows a basic configuration of an illumination device 5 according to a first preferred embodiment of the invention. The effective area of the exit surface or the exit surface of the waveguide 3 is increased with respect to the pump light entrance surface or the exit surface of the phosphor 1. The waveguide 3 corresponds to a transparent waveguide or a transparent phosphor, respectively. The illumination device 5 with a phosphor 1 comprises an exit surface adapted for emitting optical radiation, in other words emitting luminescent optical radiation or luminescent light, and a side surface surrounding the phosphor 1. A light source 2 is provided which is adapted for emitting optical radiation directed to the phosphor 1. The phosphor 1 is capable of converting at least part of the wavelength of radiation emitted from the light source to a wavelength different from the wavelength of radiation emitted. The light source corresponds to a solid state light source, such as a light emitting diode or a laser diode. Such diodes preferably emit in the ultraviolet, violet and/or blue part of the spectrum.

The phosphor 1 comprises at least one light emitting surface which is adapted for emitting phosphor light in a predefined solid angle. The light source 2 is adapted for emitting optical radiation directed to the phosphor 1. Further, a reflector 4 is provided. FIG. 1 shows that the phosphor 1 is optically coupled to the waveguide 3 and that the exit surface of the illumination device 5 from which light is emitted is larger than any single light emitting surface of the phosphor 1. It is noted that the reflector 4 is adapted for reflecting at least a part of the optical radiation emitted from the illumination device 5 by a surface different from the exit surface of the illumination device 5.

An entrance surface of the waveguide 3 is adapted for irradiating optical radiation coming from the exit surface of the phosphor 1 to an exit surface of the waveguide 3. It is noted that the effective area of the exit surface of the waveguide 3 is larger than the effective area of the exit surface of the phosphor 1 and that the reflector 4 is arranged on at least a part of the side surface of the phosphor 1 and is adapted for reflecting optical radiation, emitted from the phosphor 1, diffusely redirecting light or radiation to different angles. However, according to the first preferred embodiment of the invention the reflector 4 is arranged on the side surface of the phosphor 1 and also surrounds the side surface of the waveguide 3 where again the diffuse reflector redirects light so that light escapes from the exit surface of the waveguide 3. In this embodiment the effective exit surface of the illumination device 5 equals the exit surface of the waveguide 3.

Figure 2:
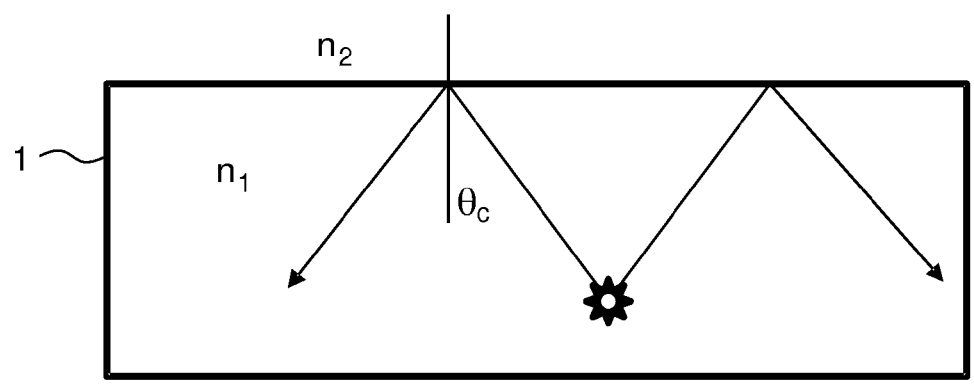
FIG. 2 shows a transparent phosphor according to a second preferred embodiment of the invention.

FIG. 2 shows a transparent phosphor according to a second preferred embodiment of the invention and illustrates the effect of total internal reflection in a block of transparent phosphor 1. If one considers light emission at a point within the transparent phosphor 1, the escape cone from a flat surface is given by $2 \cdot \Theta_2$. The critical angle for TIR is given by $$\sin(\Theta_c) = n_2/n_1.$$

If it is assumed that the second refractive index $n_2$ corresponds to 1, i.e. the second medium is air, and that the first medium comprises YAG phosphor with the first refractive index $n_1$ of 1.83, then the critical angle of TIR corresponds to 33.1°. In other words, only 16.7% of the light emitted in the direction of the exit surface of the phosphor 1 will escape from this surface and the rest will become reflected.

FIGS. 3a to 3e show illumination devices 5 according to a third preferred embodiment of the invention. A material with a refractive index similar to the refractive index of the phosphor 1 is used and thus a surface is created so that light escapes to air with minimum reflection back into the phosphor 1. According to the third preferred embodiment of the invention shown in FIG. 3a, the reflector 4 corresponds to a diffuse reflector and the optical coupling between the phosphor 1 and the waveguide 3 corresponds to an optical matching of the refractive indexes of the phosphor 1 and the waveguide 3. In this way, much more light is forced out from the exit surface of the phosphor 1 and escapes from the exit surface of the waveguide 3. In this embodiment layers 1 and 3 are optically coupled with a refractive index matching material (not shown).

Assuming that the phosphor 1 shows an infinitively large surface area, no self absorption, light is emitted from a point isotropically and light escapes from the exit surface of the waveguide 3 into the waveguide 3 while it undergoes TIR at the entrance surface, then the ratio of light intensity from the exit surface of the phosphor 1, represented by $I_1$, to the intensity from the entrance surface of the phosphor 1 where pump light enters the phosphor for exciting the phosphor 1, represented by $I_2$, is given by:

$$\text{Solid angle } 33.1 \; deg = 2\pi * (1 - \cos(33.1)) = 1.01$$

$$\frac{I_1}{I_2} = \frac{4\pi - 1.01}{1.01} = \frac{11.55}{1.01} = 11.47$$

This means that about 11.47 times more light is coupled out from the exit surface of the phosphor 1 than coupled in to the entrance surface. In practice, the phosphor 1 shows some intrinsic scattering and a limited dimension and also the side surfaces play a role. The light coupled into the waveguide 3 in this embodiment is coupled out of the illumination device 5 by the diffuse reflector 4 so that it escapes the illumination device 5 from the exit surface of the waveguide 3.

Figure 3A:
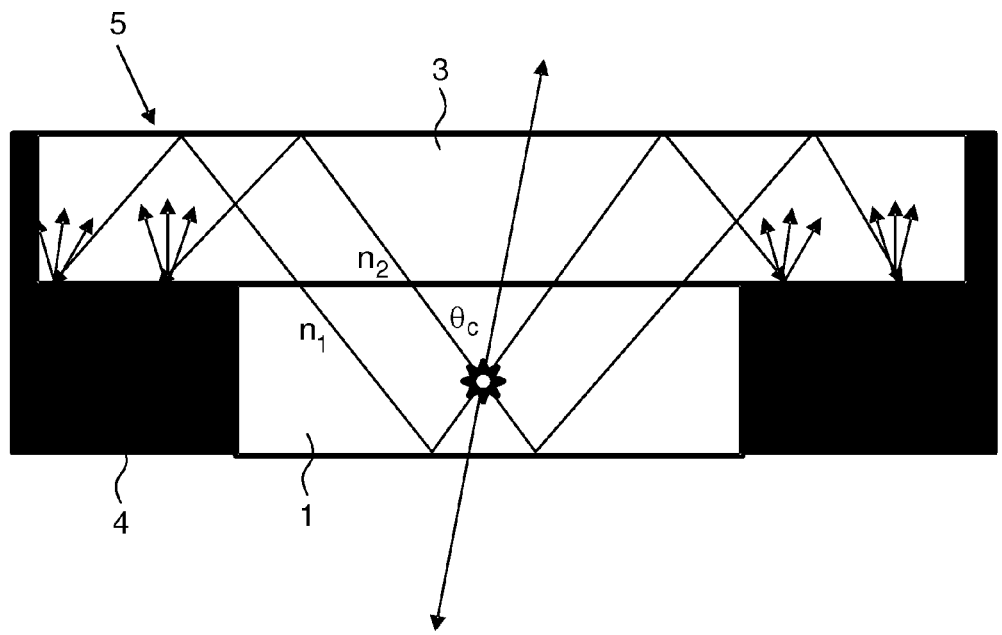
FIGS. 3a to 3e show illumination devices according to a third preferred embodiment of the invention.
Figure 3B:
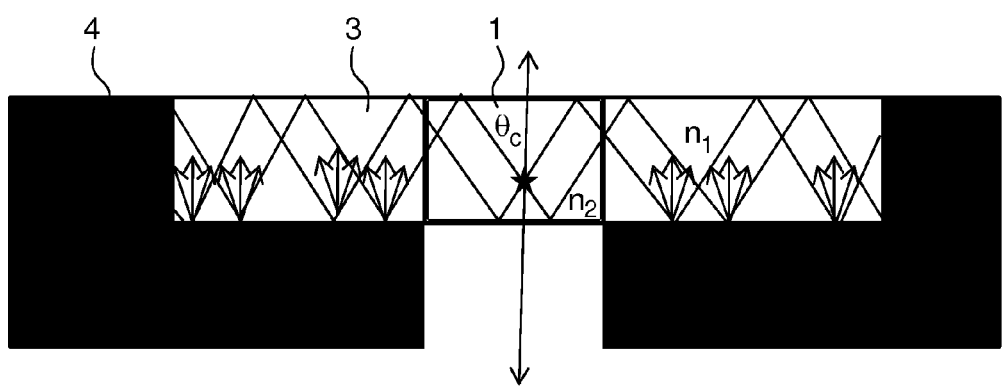
Figure 3C:
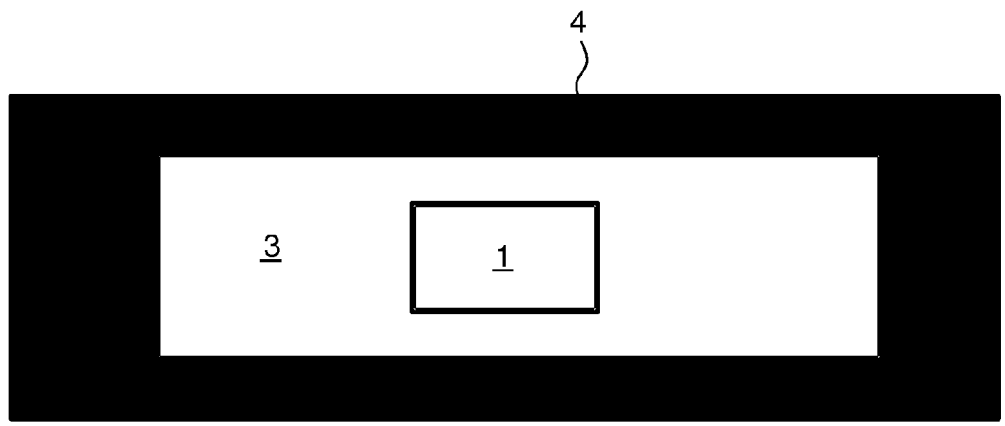
Figure 3D:
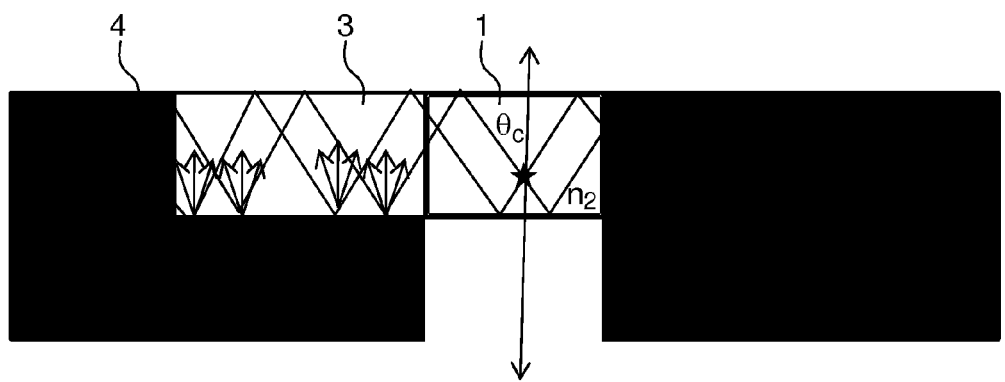
Figure 3E:
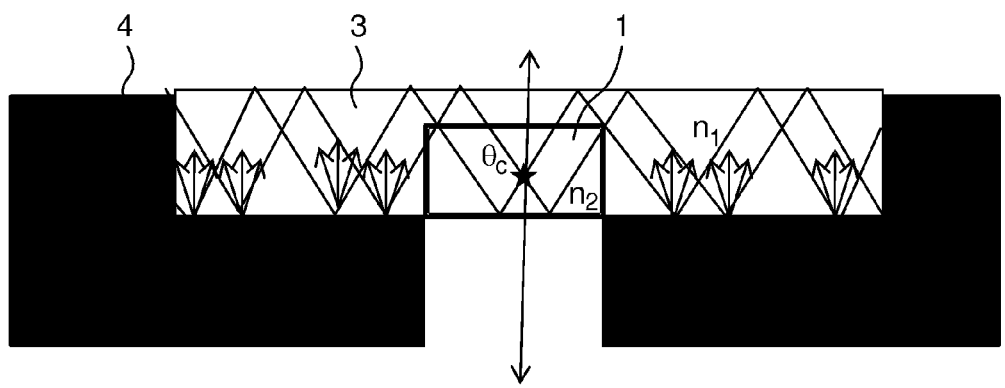

FIG. 3b shows a cross section of the illumination device 5, where at least one side surface of the phosphor 1 is optically coupled to a side surface of the waveguide 3. In this embodiment, layers 1 and 3 are optically coupled with a refractive index matching material (not shown). Here again the total effective exit surface of the illumination device 5, i.e. the exit surface of the phosphor 1 and of the waveguide 3, is increased by optical coupling of the waveguide 3 from the sides. FIG. 3c shows a top view of the illumination device 5 of FIG. 3b. Here, the waveguide 3 is coupled to the phosphor 1 from all four side surfaces. However, it is also possible to couple it from a single side as shown in FIG. 3d. As shown in FIG. 3e, it is also possible that the waveguide 3 is coupled to the phosphor 1 from the sides as well as from the top. In this embodiment the diffuse reflector 4 is used for redirecting light so that light escapes from the effective exit surface of the illumination device 5, where the effective exit surface of the illumination device 5 is given by the sum of the exit surface of the phosphor 1 and the exit surface of the waveguide 3.

Figure 4:
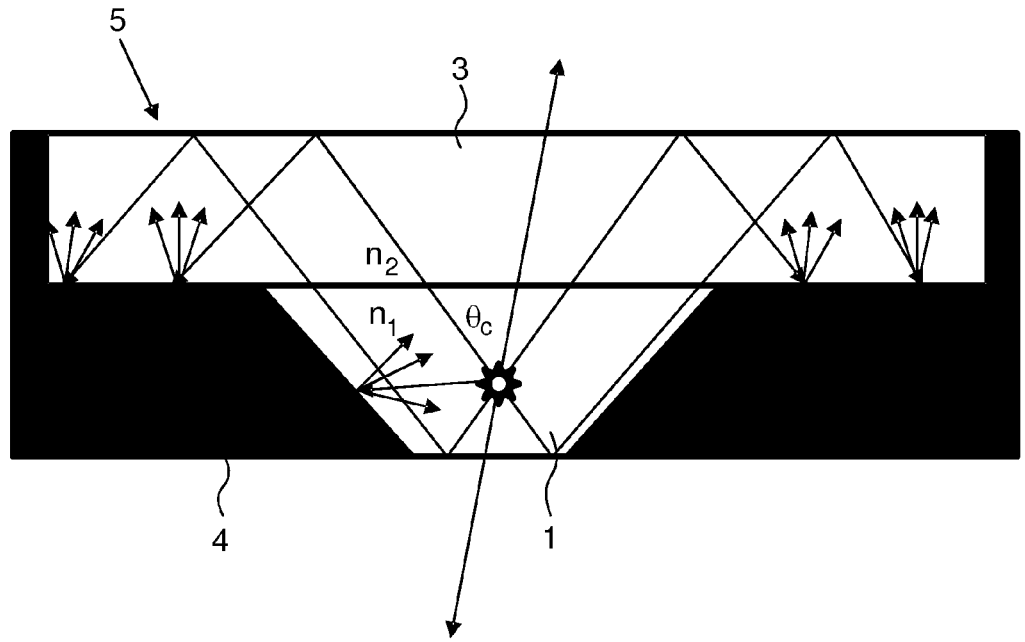
FIG. 4 shows an illumination device according to a fourth preferred embodiment of the invention.

FIG. 4 shows an illumination device according to a fourth preferred embodiment of the invention. Since it is desirable to have light falling onto the side surfaces of the phosphor 1 sent towards the exit surface of the phosphor 1, various inclined surfaces for the side surfaces can be considered. The side surface comprises an inclination angle to the entrance surface of the waveguide 3 different from a perpendicular angle. According to another preferred embodiment of the invention, the side surface comprises an inclination angle to the entrance surface of the waveguide 3 being equal to a perpendicular angle. In the same way one can also adjust the aspect ratio of the phosphor 1. The ratio of the area of the exit surface of the phosphor 1 with respect to the total surface area is adjusted for an increased light output ratio from the surface with respect to the entrance surface of the phosphor 1. In the same way, the aspect ratio of the phosphor 1 is also adjusted. The ratio between the area of the exit surface of the phosphor 1 and the total surface area is adjusted for an increased light output ratio from the surface with respect to the entrance surface of the phosphor 1.

Figure 5:
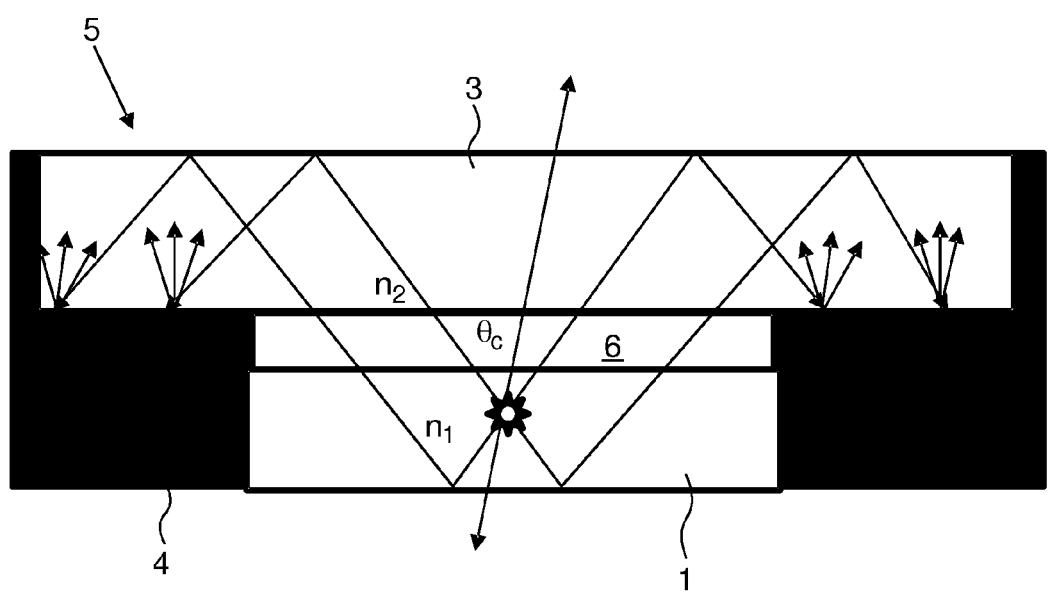
FIG. 5 shows an illumination device according to a fifth preferred embodiment of the invention.

FIG. 5 shows an illumination device according to a fifth preferred embodiment of the invention. The aspect ratio of the phosphor 1 is increased by changing the shape of the phosphor 1. According to the fifth preferred embodiment of the invention, this is done by placing another transparent layer 6 comprising a transparent material, which may also be luminescent, on top of the phosphor 1. By placing the intermediate transparent layer 6 between the phosphor 1 and the waveguide 3, light extraction efficiency is even becoming larger.

Figure 6:
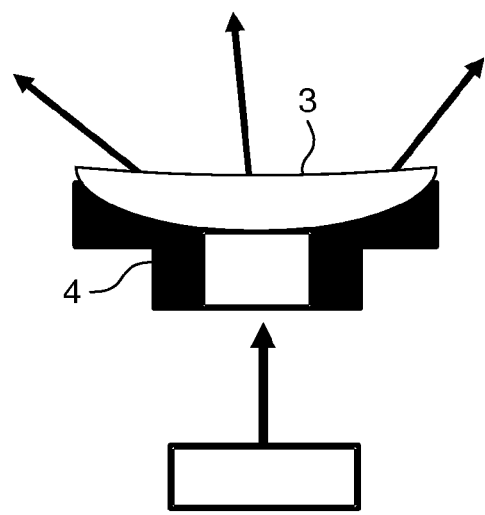
FIG. 6 shows a transparent layer according to a sixth preferred embodiment of the invention.
Figure 7:
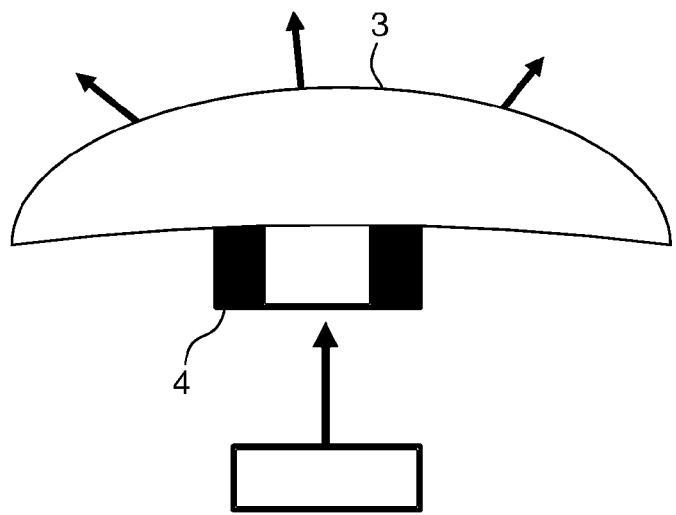
FIG. 7 shows a transparent layer according to a seventh preferred embodiment of the invention.
Figure 8:
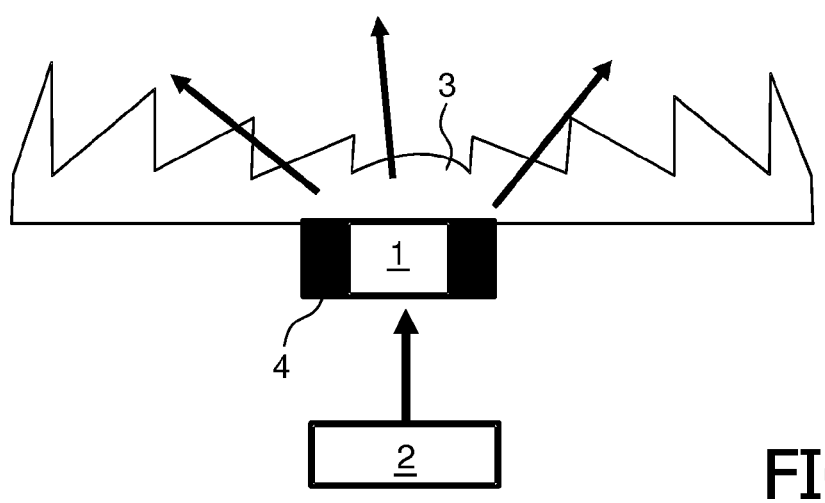
FIG. 8 shows a transparent layer comprising a Fresnel lens according to an eighth preferred embodiment of the invention.

FIG. 6, FIG. 7 and FIG. 8 show different preferred embodiments of the invention. The size, thickness and the shape of the exit surface of the waveguide 3 plays an important role. According to a sixth preferred embodiment of the invention, as shown in FIG. 6, a surface of the waveguide 3 being in contact with the reflector is not planar, as in other embodiments, but shows a concave surface. Such a surface can be convex, concave curved, wedge shaped and/or a truncated pyramid. According to a seventh preferred embodiment of the invention, as shown in FIG. 7, the exit surface shows a convex surface. According to an eighth preferred embodiment of the invention, as shown in FIG. 8, the exit surface shows a zigzag shape corresponding to a Fresnel lens. When a planar waveguide such as shown in FIG. 3 is used, the edges of the waveguide comprise an angle different from 90° rather than being perpendicular to the surface. Furthermore it is also possible to roughen the exit surface of the waveguide in order to increase the light extraction.

Figure 9:
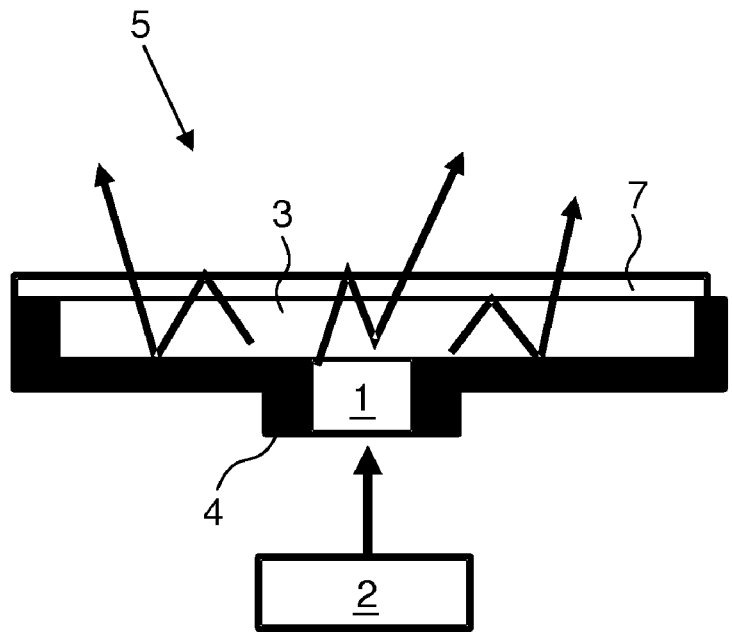
FIG. 9 shows an illumination device comprising a functional film according to a ninth preferred embodiment of the invention.

Referring back to the first preferred embodiment of the invention, it is possible to place additional films on top of the transparent material of the waveguide 3 in order to get additional effects. According to a ninth preferred embodiment of the invention, as shown in FIG. 9, the use of a functional film 7 is shown. According to the ninth preferred embodiment of the invention, the use of a reflective polarizer comprised by the functional film 7 results in polarized light by using so called brightness enhancement foils which leads to more collimated beams.

Figure 10:
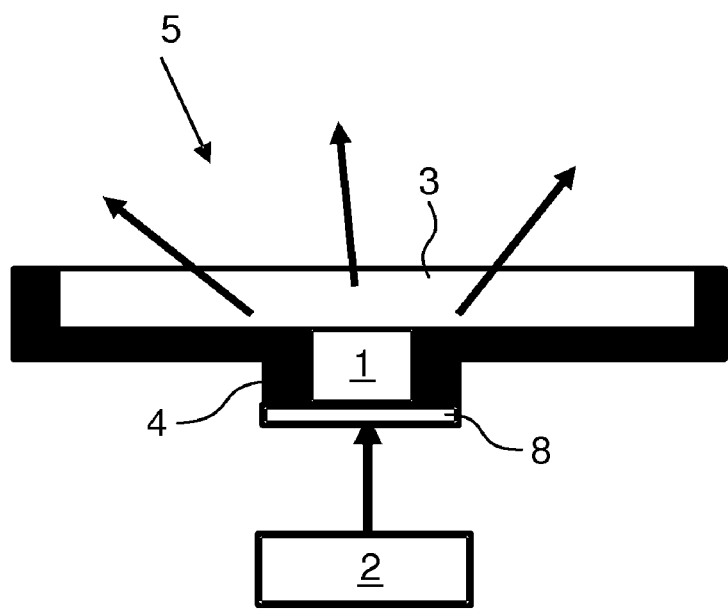
FIG. 10 shows an illumination device comprising a selective reflector according to a tenth preferred embodiment of the invention.

According to the preferred embodiments of the invention described so far, it has been shown that the extraction enhancement from a single surface is increased. When an LED is used as light source 2, it can just be placed behind the entrance surface of the phosphor 1. However, in case of a laser it is advantageous to place a selective reflector 8 behind the surface which selectively transmits the pump wavelength and/or reflects the light emitted by the phosphor 1. This is shown in FIG. 10 representing the tenth preferred embodiment of the invention. According to other preferred embodiments of the invention, the illumination device 5 comprises a heat sink adapted for cooling the phosphor 1. As a waveguide material, when no heat sinking via the waveguide is necessary, materials with low heat conductivity such as glass and/or a transparent polymer, such as silicone rubber, can be used. For heat sinking via the waveguide materials with high heat conductivity, such as alumina and sapphire, can be used. In the same way heat sinking can also be done via the diffuse reflector. For this purpose a diffuse layer with a high heat conductivity can be used. Oxide material with a high heat conductivity, such as boron nitride, aluminum oxide and yttrium oxide, are highly suitable. Partial sintering of these materials also improves their heat conductivity while preserving their high reflectivity. It also goes without saying that metallic reflectors with a high heat conductivity are highly suitable.

Referring back to the reflecting layer 4 it is preferably a diffuse reflecting layer with high reflectivity and it is preferably applied when no light extraction structures are used on top of the waveguide. In that case, it is important that light in the waveguide is not guided but coupled out by the scattering reflector 4. According to other preferred embodiments of the invention, this layer comprises a luminescent material for converting the wavelength of the light falling onto it.

Referring back to the first preferred embodiment of the invention, transparent Ce:YAG with 0.4% Ce ceramic is used. The thickness of the ceramic corresponds to 140 microns and ceramics with different cross sections have been used. Further, a titanium dioxide or $TiO_x$, reflective coating has been used as a scattering reflector 4 to construct the illumination device 5. The illumination device 5 is pumped using a laser emitting at 450 nm. In all cases much more light is extracted from the exit surface of the phosphor 1 compared with the entrance surface of the phosphor 1. It is noted that the total conversion efficiency is around 90% which also corresponds to the bulk quantum efficiency of the material. Finally, referring to the tenth preferred embodiment of the invention, and as shown in FIG. 10, light extraction efficiency has been measured with a sample of dimensions 1 mm×1 mm. Almost 100% of the light could be extracted from the exit surface of the waveguide 3 when the entrance surface of transparent Ce:YAG (0.4% Ce) was coated directly with a multilayer dielectric reflector 8 which transmitted blue laser radiation (540 nm) and reflected yellow light emission from the ceramic, and the quantum efficiency of the illumination device remained at around 90%.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An illumination device comprising
a phosphor having one entrance surface for receiving optical radiation and at least one light emitting surface for emitting phosphor light in a predefined solid angle,
a remote light source for emitting said optical radiation and directing it to said entrance surface of the phosphor,
a waveguide, and
a reflector at least partly arranged around said phosphor, wherein
said at least one light emitting surface of the phosphor is optically coupled to the waveguide,
an exit surface of the illumination device from which light is emitted is larger than any single light emitting surface of the phosphor, and
the reflector is configured for reflecting at least a part of the optical radiation emitted from the illumination device by a surface different from the exit surface of the illumination device, and said at least one light emitting surface of said phosphor having an effective light emitting area which is larger than said entrance surface.

2. The illumination device according to claim 1, wherein the waveguide comprises an optical contact with the phosphor from at least one light emitting surface.

3. The illumination device according to claim 1, wherein the phosphor comprises a low scattering transparent material.

4. The illumination device according to claim 3, wherein the low scattering transparent material comprises a ceramic phosphor and/or a polymer doped with organic phosphor.

5. The illumination device according to claim 1, wherein the reflector comprises a diffuse reflector.

6. The illumination device according to claim 1, wherein the waveguide comprises a flat waveguide coupled from a top surface and/or a side surface to the phosphor.

7. The illumination device according to claim 1, wherein the waveguide comprises a diffuse reflector.

8. The illumination device according to claim 1, wherein the optical coupling between the phosphor and the waveguide comprises a material with a refractive index $\geq 1.4$ matching a refractive index of the phosphor or the waveguide.

9. The illumination device according to claim 1, wherein a side surface of the phosphor comprises an inclination angle to the entrance surface of the waveguide different from a perpendicular angle.

10. The illumination device according to claim 1, further comprising a transparent layer with a transparent material different from the material of the waveguide, wherein the transparent layer is arranged between the phosphor and the waveguide.

11. The illumination device according to claim 1, wherein an exit surface of the waveguide and/or the exit surface of the illumination device comprises a shape corresponding to a plain shape, a concave shape, a convex shape and/or a zigzag shape.

12. The illumination device according to claim 11, wherein the zigzag shape corresponds to a Fresnel lens.

13. The illumination device according to claim 1, further comprising at least a film arranged on top of an exit surface of the waveguide for polarizing the optical radiation irradiated from the exit surface of the waveguide.

14. The illumination device according claim 1, further comprising a selective reflector adapted for selectively transmitting and/or reflecting optical radiation, wherein the selective reflector is arranged in an optical path between the light source and the phosphor.

15. The illumination device according to claim 1, further comprising a heat sink for cooling the phosphor.

* * * * *